United States Patent
Takada et al.

(10) Patent No.: US 8,723,234 B2
(45) Date of Patent: May 13, 2014

(54) SEMICONDUCTOR DEVICE HAVING A DIODE FORMING AREA FORMED BETWEEN A FIELD-EFFECT TRANSISTOR FORMING AREA AND A SOURCE ELECTRODE BUS WIRING OR PAD

(75) Inventors: Yoshiharu Takada, Kanagawa (JP); Kentaro Ikeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/227,014

(22) Filed: Sep. 7, 2011

(65) Prior Publication Data
US 2012/0228632 A1  Sep. 13, 2012

(30) Foreign Application Priority Data
Mar. 10, 2011 (JP) ................. 2011-052783

(51) Int. Cl.
*H01L 21/02* (2006.01)
*H01L 29/66* (2006.01)

(52) U.S. Cl.
USPC ........... 257/272; 257/155; 257/161; 257/268; 257/280; 257/281; 257/282; 257/283; 257/284

(58) Field of Classification Search
USPC ......... 257/272, 280–284, 268, 287, 471, 472, 257/476, 481; 438/190, 167, 570, 173, 576, 438/193, 195, 92, 172, 572, 602, 171, 91, 438/380, 983
See application file for complete search history.

(56) References Cited

U.S. PATENT DOCUMENTS

| | | | |
|---|---|---|---|
| 6,965,150 B2 | 11/2005 | Higashida et al. | |
| 2006/0151816 A1* | 7/2006 | Asano et al. | 257/275 |
| 2006/0163659 A1* | 7/2006 | Asano et al. | 257/357 |
| 2010/0019279 A1* | 1/2010 | Chen et al. | 257/194 |
| 2010/0078732 A1 | 4/2010 | Takada | |

FOREIGN PATENT DOCUMENTS

| | | |
|---|---|---|
| JP | 57-80857 U | 5/1982 |
| JP | 62-213175 A | 9/1987 |
| JP | 03-027566 | 2/1991 |
| JP | 06-326248 A | 11/1994 |
| JP | 2001-326354 | 11/2001 |
| JP | 2010-80815 | 4/2010 |
| JP | 2011-9289 A | 1/2011 |

OTHER PUBLICATIONS

U.S. Appl. No. 12/881,842, filed Sep. 14, 2010, Kentaro Ikeda (Continued)

*Primary Examiner* — Steven Loke
*Assistant Examiner* — Juanita B Rhodes
(74) *Attorney, Agent, or Firm* — Oblon, Spivak, McClelland, Maier & Neustadt, L.L.P.

(57) ABSTRACT

A semiconductor device of an embodiment includes: a semiconductor substrate; a field-effect transistor formed on the semiconductor substrate; and a diode forming area which is adjacent to a forming area of the field-effect transistor, wherein the diode forming area is insulated from the forming area of the transistor on the semiconductor substrate, and includes a first diode electrode in which a gate electrode of the field-effect transistor is placed in Schottky barrier junction and/or ohmic contact with the semiconductor substrate through a bus wiring or a pad; and a second diode electrode in which a source electrode of the field-effect transistor is placed in ohmic contact and/or Schottky barrier junction with the semiconductor substrate through a bus interconnection or a pad to form a diode between the gate electrode and the source electrode.

13 Claims, 9 Drawing Sheets

(56) References Cited

OTHER PUBLICATIONS

U.S. Appl. No. 13/408,452, filed Feb. 29, 2012, Takada.
Japanese Office Action issued on Dec. 18, 2012, in patent Application No. 2011-052783 with English translation.
Japanese Office Action issued Aug. 13, 2013, in Japanese Patent Application No. 2011-052783 filed Mar. 10, 2011 (with English-language translation).
Office Action issued Dec. 3, 2013, in Japanese Patent Application No. 2011-052783, filed Mar. 10, 2011 (with English-language translation).

* cited by examiner

SEMICONDUCTOR DEVICE HAVING A DIODE FORMING AREA FORMED BETWEEN A FIELD-EFFECT TRANSISTOR FORMING AREA AND A SOURCE ELECTRODE BUS WIRING OR PAD

CROSS-REFERENCE TO RELATED APPLICATION

This application is based upon and claims the benefit of priority from Japanese Patent Applications No. 2011-052783, filed on Mar. 10, 2011; the entire contents of which are incorporated herein by reference.

FIELD

Embodiments described herein relate generally to a semiconductor device.

BACKGROUND

A wide-gap semiconductor such as Gallium Nitride (GaN) or Silicon Carbide (SiC) has better characteristics such as a high critical electrical field and thermal conductivity as compared to Silicon (Si), and is being actively studied and developed in recent years to put into production for power devices. Particularly, GaN based high electron mobility transistors (HEMTs) such as AlGaN/GaN HEMTs with two-dimensional electron gas channel have a high electron mobility and carrier density. This allows GaN devices to realize good high frequency characteristics and low on-state resistance as compared to Si devices and receive a great expectation as one of the most promising candidates for future switching power device for power electronics applications.

Meanwhile, a GaN device having a typical AlGaN/GaN heterojunction channel is a normally on type in which a gate threshold voltage is a negative voltage, and has a concern that the gate electrode is broken down easily when an excessive positive voltage is applied to the gate electrode. In order to avoid breaking down of the gate electrode, a diode which clips the gate voltage to protect the gate electrode is generally provided between a gate and source outside a chip, and therefore there are problems that the number of parts of a circuit increases and interconnections on a circuit substrate become complicated.

DETAILED DESCRIPTION

A semiconductor device of an embodiment includes: a semiconductor substrate; a field-effect transistor formed on the semiconductor substrate; and a diode forming area which is adjacent to a forming area of the field-effect transistor, wherein the diode forming area is insulated from the forming area of the transistor on the semiconductor substrate, and includes a first diode electrode in which a gate electrode of the field-effect transistor is placed in Schottky barrier junction and/or ohmic contact with the semiconductor substrate through a bus interconnection or a pad; and a second diode electrode in which a source electrode of the field-effect transistor is placed in ohmic contact and/or Schottky barrier junction with the semiconductor substrate through a bus interconnection or a pad to form a diode between the gate electrode and the source electrode.

Embodiments of the invention will be described below with reference to the drawings.

Next, embodiments of the present invention will be described with reference to the drawings.

First Embodiment

Figure 1:
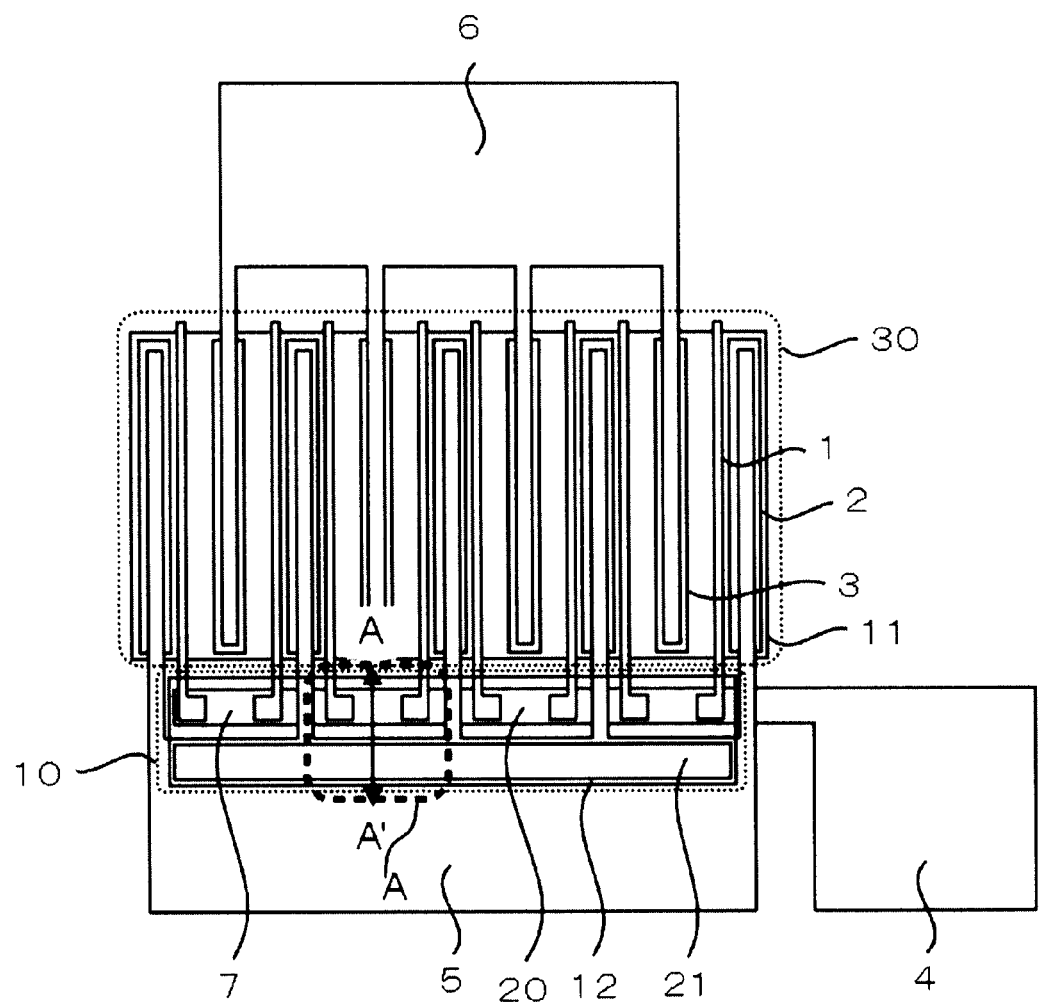
FIG. 1 is a top view of a semiconductor device according to a first embodiment.
Figure 2:
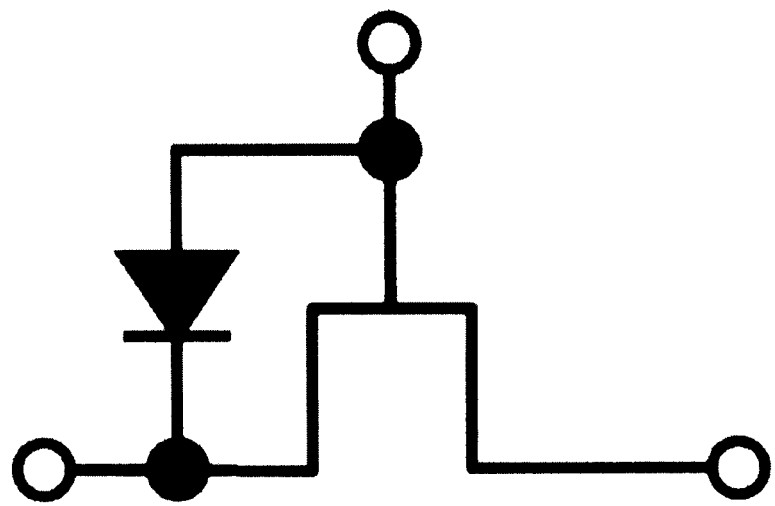
FIG. 2 is an example of a circuit diagram of the semiconductor device according to the first embodiment.

A configuration of a semiconductor device according to the first embodiment will be described based on the drawings. FIG. 1 is a top view of a semiconductor device according to the first embodiment, and FIG. 2 is a circuit diagram of a semiconductor device according to the first embodiment.

With a semiconductor device 1 according to the first embodiment, a field-effect transistor 11 and a diode 10 which protects a gate electrode 1 of the field-effect transistor 11 are formed on a single semiconductor substrate 9 (on one chip). The field-effect transistor 11 is formed in a transistor forming area 30 on the semiconductor substrate 9, and the diode 10 is formed in a diode forming area 12 on the semiconductor substrate 9. The transistor forming area 30 and diode forming area 12 are electrically insulated on the semiconductor substrate 9 by mesa-isolating the semiconductor substrate 9 or implanting ions to the semiconductor substrate 9. The field-effect transistor 11 according to the first embodiment is normally on type AlGaN/GaN-HEMT adopting an insulating gate structure, and combinations of the gate electrode 1, source electrode 2 and drain electrode 3 are arranged to be bent back symmetrically in a comb shape. The gate electrodes 1 of the field-effect transistor 11 are connected to a gate electrode bus wiring 7 which bundles these gate electrodes 1. The source electrodes 2 are connected with a source electrode pad 5 which bundles these source electrodes 2. The drain electrodes 3 are connected with a drain electrode pad 6 which bundles these drain electrodes 3. The gate electrodes 1 and at least part of the gate electrode bus wiring 7 according to the present embodiment are made of the same metal. The source electrodes 2 and at least part of the source electrode bus 8 according to the present embodiment are made of the same metal. Portions of the gate electrode bus wiring 7 on the diode forming area 12 are placed in Schottky barrier junction with the semiconductor substrate 9 to form anode electrodes 20 (first diode electrodes) of the diode 10. A portion of the source electrode pad 5 on the diode forming area 12 is placed in ohmic contact with the semiconductor substrate 9 to form a cathode electrode 21 (second diode electrode) of the diode 12.

The first and second diode electrodes 20 and 21 form the diode 10. An end of the gate electrode bus wiring 7 is a gate electrode pad 4 and functions as a terminal which can be connected with an external circuit.

Figure 3:
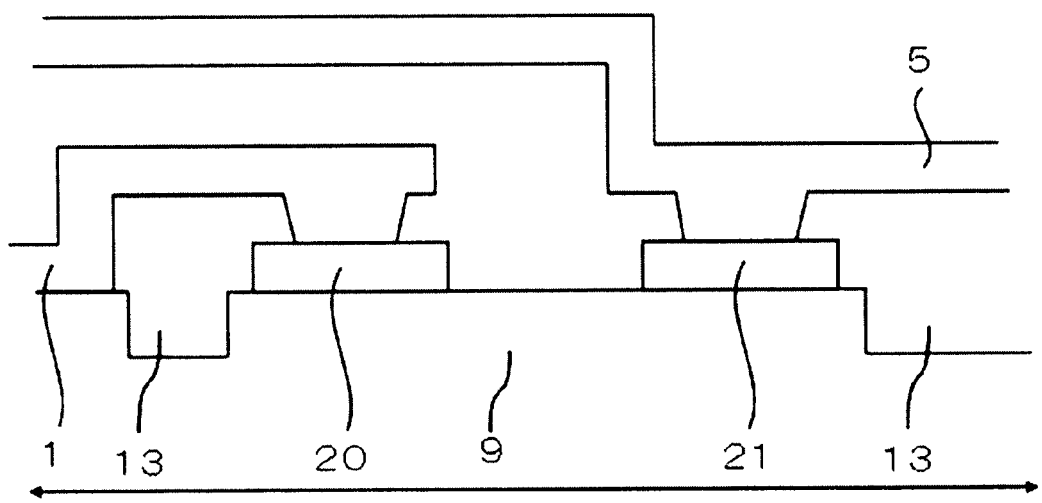
FIG. 3 is an example of a sectional view of A-A' of the semiconductor device according to the first embodiment.
Figure 4:
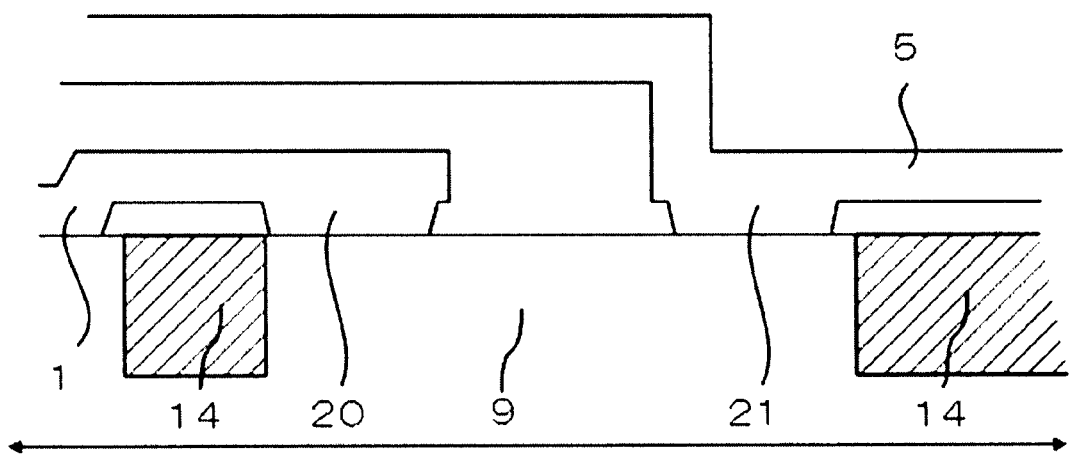
FIG. 4 is an example of a sectional view of A-A' of the semiconductor device according to the first embodiment.

FIGS. 3 and 4 are examples of sectional views in A-A' of an A area in FIG. 1 (an area surrounded by a dotted line and including an A-A' arrow). The sectional view in FIG. 3 shows a mode where device forming areas 12 and 30 are formed as mesa-isolated areas 13 by an etching process of a semiconductor layer, the gate electrode bus interconnection 7 which becomes the gate electrodes 1 and anode electrodes 20 is separately formed and the cathode electrode 21 and source electrode pad 5 are separately formed. The sectional view of FIG. 4 illustrates a mode where the device forming areas 12 and 30 are electrically isolated from the surrounding by means of the insulating areas 14 by ion implantation, the gate electrode bus interconnection 7 which becomes the anode electrodes 20 is formed at the same time as the gate electrodes 1 are formed, and the source electrode pad 5 is used as the cathode electrode 21. In both of cases of the structures in FIGS. 3 and 4, the gate electrodes 1 and source electrode pad 5 are electrically insulated by an SiO$_2$ film, SiN film, the insulating film 15 formed with a layered film of the SiO$_2$ film and SiN film.

With the semiconductor device according to the present embodiment, the diode 10 is formed in an area provided to secure electrical insulation between the conventional gate electrode bus interconnection 7 and source electrode pad 5, so that it is possible to add a diode for protecting a gate electrode without increasing a chip area and provide an advantage in terms of cost of materials. With the semiconductor device according to the present embodiment, the diode 10 is formed between the field-effect transistor forming area 30 and source electrode pad 5, so that a interconnection length between the gate electrodes 1 of the transistor 11 and the diode 10 for protecting the gate electrodes 1 becomes very short and a parasite component due to the interconnection length can be removed, and, consequently, the gate electrode protection effect is high. When the diode 10 is formed similar to the semiconductor devices according to the present embodiment, the semiconductor device can be made according to the same procedure as a conventional process in which the diode 10 is not formed. Consequently, it is not necessary to specially add new manufacturing process to make the semiconductor device according to the present embodiment. The semiconductor device according to the present embodiment provides an advantage of manufacturing process cost.

Second Embodiment

Figure 5:
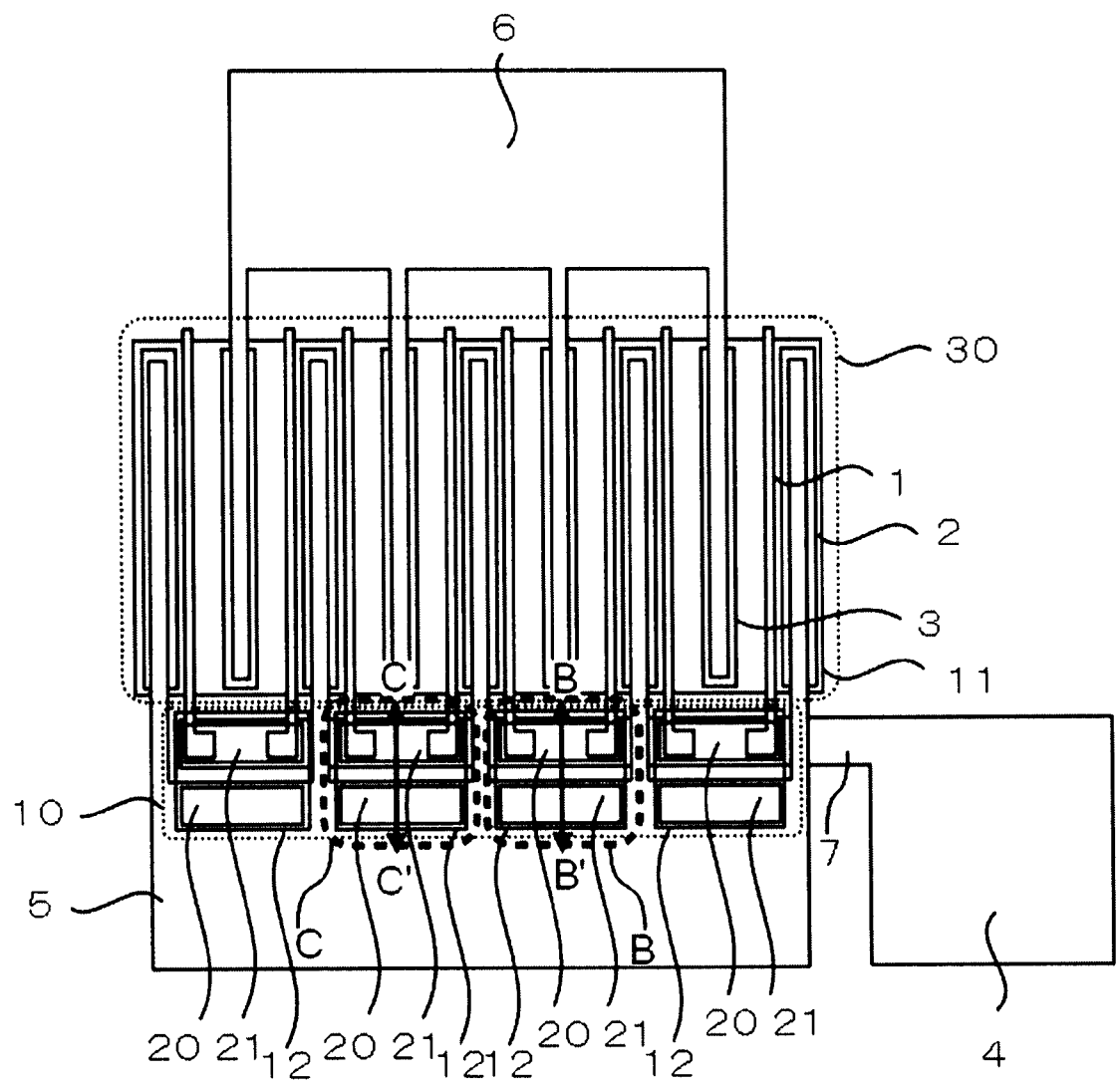
FIG. 5 is a top view of a semiconductor device according to a second embodiment.
Figure 6:
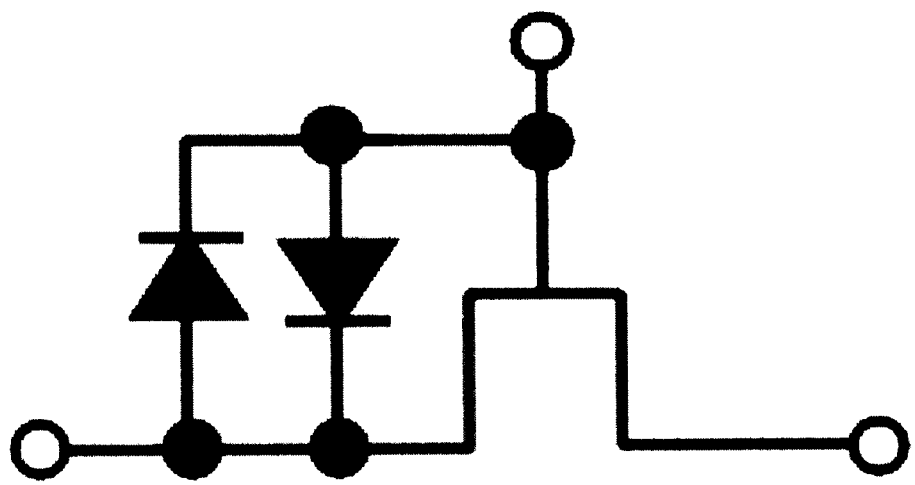
FIG. 6 is a circuit diagram of the semiconductor device according to the second embodiment.

In the second embodiment, normally off type AlGaN/GaN HEMT with insulating gate structures is used for the field-effect transistor 11. FIG. 5 illustrates a top view according to the second embodiment. FIG. 6 illustrates a circuit diagram according to the second embodiment.

With the normally off type, a diode for protecting the gate electrodes 1 is required to have bidirectional diode characteristics of bidirectionally clipping the voltages on the position voltage side and negative voltage side. Hence, the bidirectional diode 16 is formed as a gate electrode protecting diode.

The semiconductor device according to the second embodiment is the same as the semiconductor device according to the first embodiment except the type of the field-effect transistor and configuration of the diode.

Figure 7:
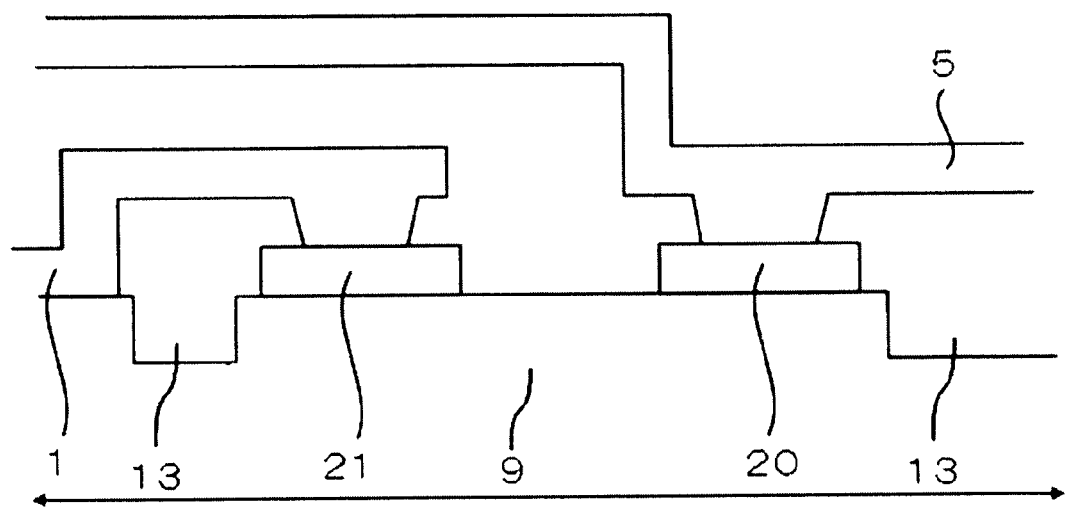
FIG. 7 is an example of a sectional view of B-B' of the semiconductor device according to the second embodiment.
Figure 8:
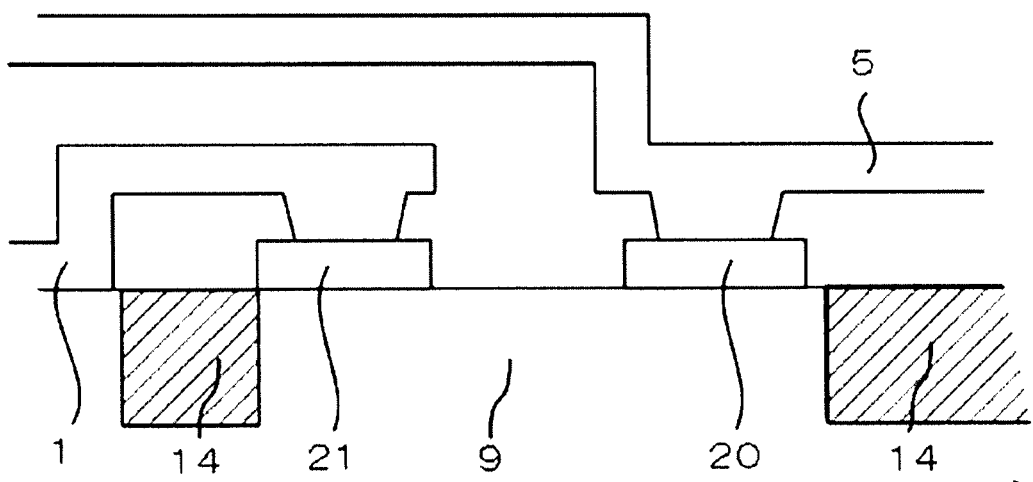
FIG. 8 is an example of a sectional view of C-C' of the semiconductor device according to the second embodiment.

The bidirectional diode 16 according to the second embodiment is formed by placing the gate electrode bus interconnection 7 and source electrode pad 5 in ohmic contact or Schottky barrier junction with the semiconductor substrate 9. The configuration other than the bidirectional diode 16 is the same as in the first embodiment. With the second embodiment, the gate electrode bus interconnection 7 and semiconductor substrate 9 are alternately placed in ohmic contact and Schottky barrier junction in order, and the source electrode pad 5 and semiconductor substrate 9 are alternately placed in ohmic contact and Schottky barrier junction in order. To be more specific, the oppositely oriented diodes 10 are formed between an adjacent B area (an area surrounded by a dotted line and including an arrow of B-B') and C area (an area surrounded by a dotted line and including an arrow of C-C') and a plurality of oppositely oriented diodes are formed to form the bidirectional diode 16. FIG. 7 is an example of a sectional view in the case where an element is mesa-isolated in the C area. In this case, the example of the B area is the same as in FIG. 3. FIG. 8 is an example of a sectional view when an element is isolated in the C area by ion implantation. In this case, the example of the B area is the same as in FIG. 4. Although the gate electrode bus interconnection 7 in the B area is placed in Schottky barrier junction with the semiconductor substrate 9 (anode electrode 20), the gate electrode bus interconnection 7 in the C area is placed in ohmic contact with the semiconductor substrate 9 (cathode electrode 21). Although the source electrode pad 5 in the B area is placed in ohmic contact with the semiconductor substrate 9 (cathode electrode 21), the source electrode pad in the C area is placed in Schottky barrier junction with the semiconductor substrate 9 (anode electrode 20). By mesa-insolating the semiconductor substrate 9 between the B area and C area and implanting ions in the semiconductor substrate 9, the B area and C area are electrically insulated on the semiconductor substrate.

Figure 9:
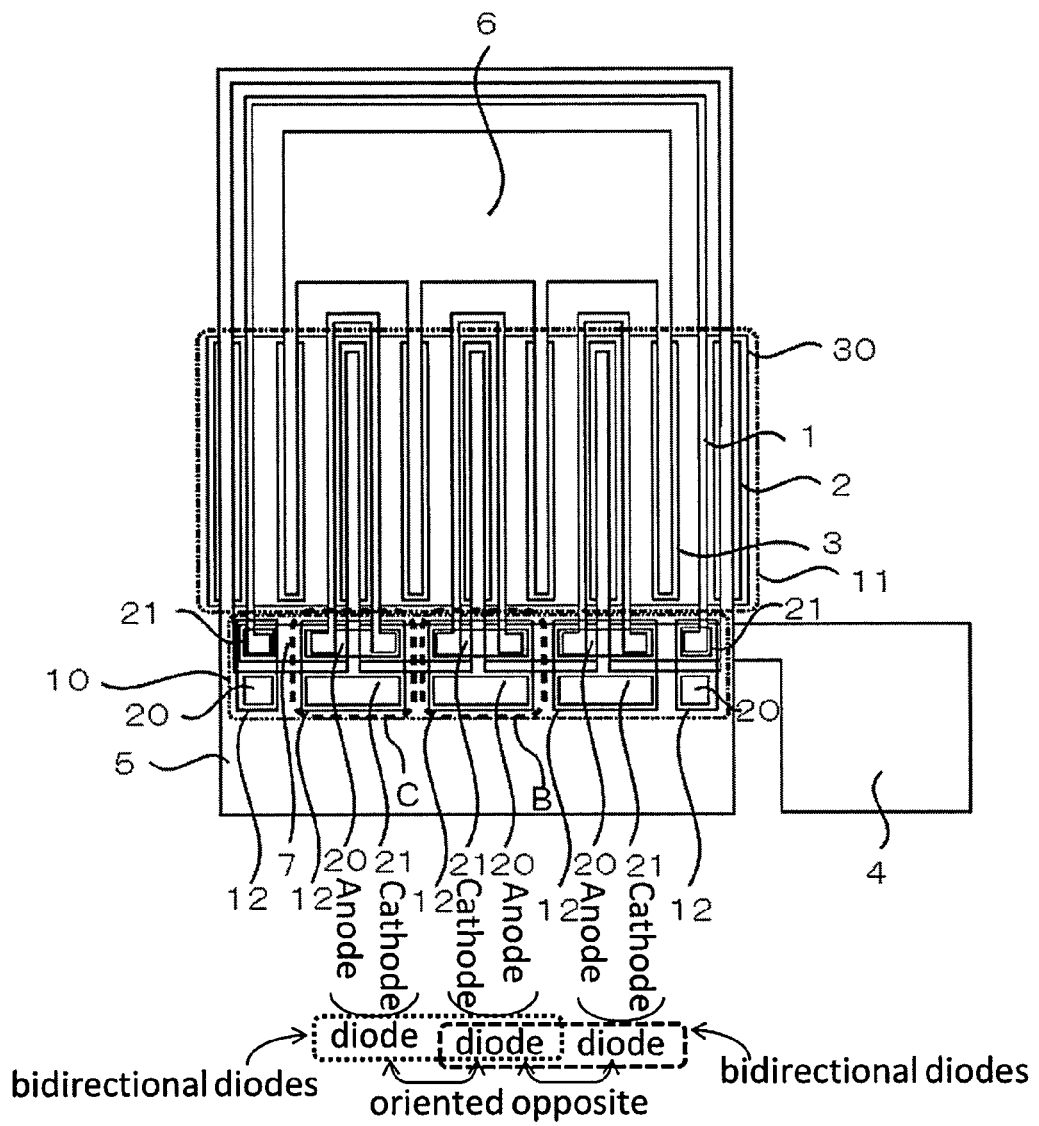
FIG. 9 is a top view of another example of the semiconductor device according to the second embodiment.

Although, in FIG. 9, oppositely oriented diodes are alternately aligned at the boundary from the source electrodes 2 to the source electrode pad, the diode forming area 12 may be provided crossing the interconnection from the source electrodes 2 to the source electrode pad as in the top view illustrated in FIG. 9. FIG. 9 illustrates an example of a chip layout adopting a termination structure of the gate electrodes 1 and source electrodes 2 taking a high-voltage operation into account. Although FIG. 9 is a conceptual diagram and shows each electrode as a rectangular shape, the termination preferably has a shape with a smooth curvature. In case of FIG. 9, two gate electrodes 1 arranged across the source electrode 2 are connected to surround the source electrode 2. Consequently, it is optimal to connect the two gate electrodes 1 aligned sandwiching the source electrode 2, to the gate protecting diode oriented in the same direction, which is a mode of the bidirectional diode illustrated in the top view of FIG. 9.

Even when the bidirectional diode 16 according to the second embodiment is formed, it is possible to provide an advantage of manufacturing a semiconductor device which provides the same advantage as in the first embodiment and in which the bidirectional diode 16 is formed, without increasing the number of manufacturing processes.

Third Embodiment

Figure 10:
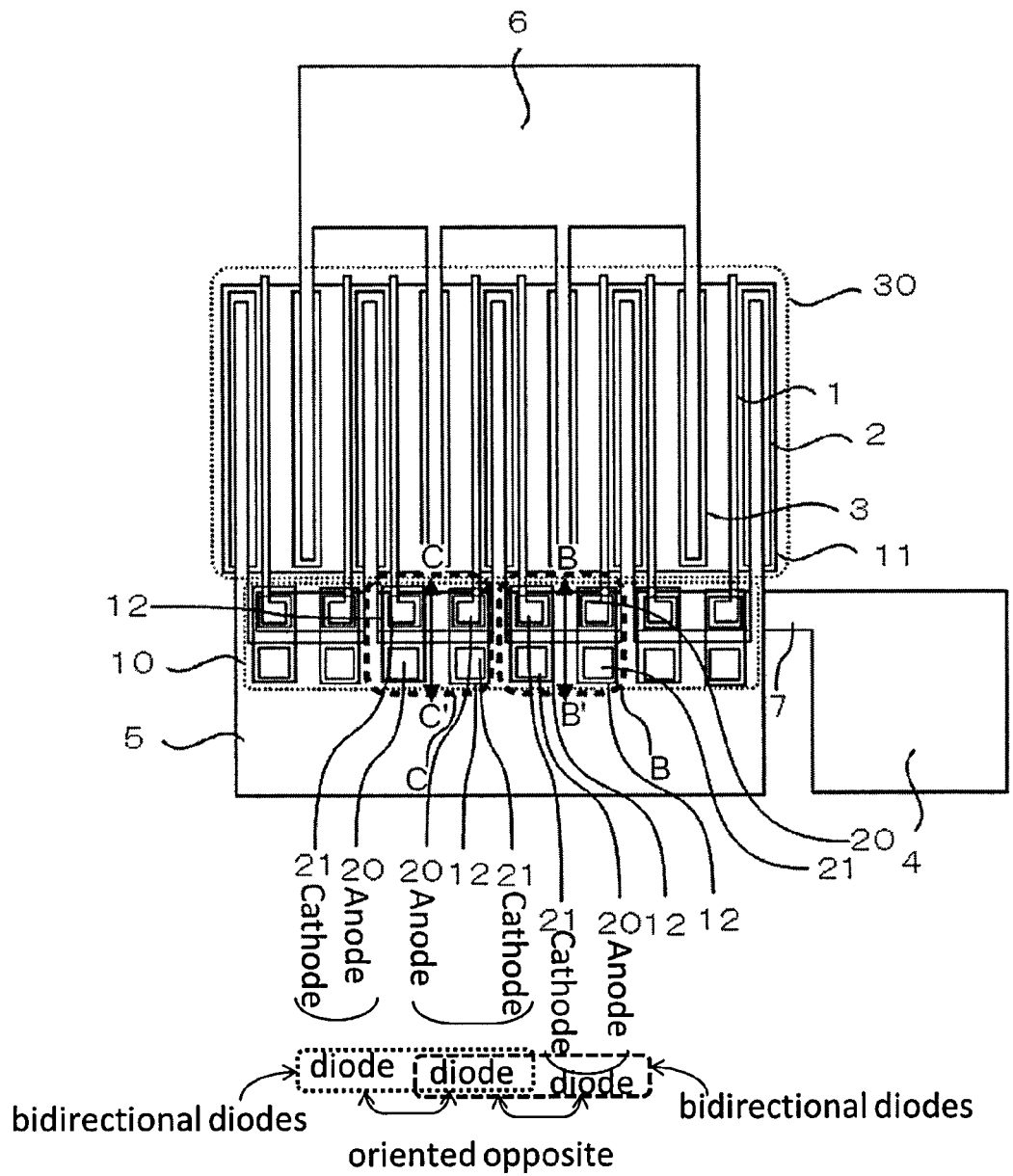
FIG. 10 is a top view of a semiconductor device according to a third embodiment.

FIG. 10 illustrates an embodiment adopting a different arrangement of the bidirectional diode 16. With the second embodiment, the diode forming areas 12 of different directions are arranged in the B and C areas and the element of the bidirectional diode 16 is formed with a pair of B and C areas. With the third embodiment, diodes of different directions are connected to each one of adjacent gate electrodes 1 and a pair of oppositely oriented diodes are formed in the B area. An anode electrode 20 and cathode electrode 21 of a protecting diode are arranged in an orientation opposite to the adjacent protecting diode. Consequently, the B area and C area adopt the same structure. The configuration other than this structure is the same as in the second embodiment. Reference numerals of diodes other than diodes in the B and C areas are not illustrated.

As in FIG. 10, by providing the protecting diode per the gate electrode 1 and alternately aligning a pair of protecting diodes, it is possible to make an operation in the chip uniform and disperse heating portions upon an operation per gate electrode 1, compared to a configuration in which oppositely oriented diodes bundling a plurality of gate electrodes 1 are alternately aligned, and, consequently, provide an advantage of improving reliability.

Fourth Embodiment

Figure 11:
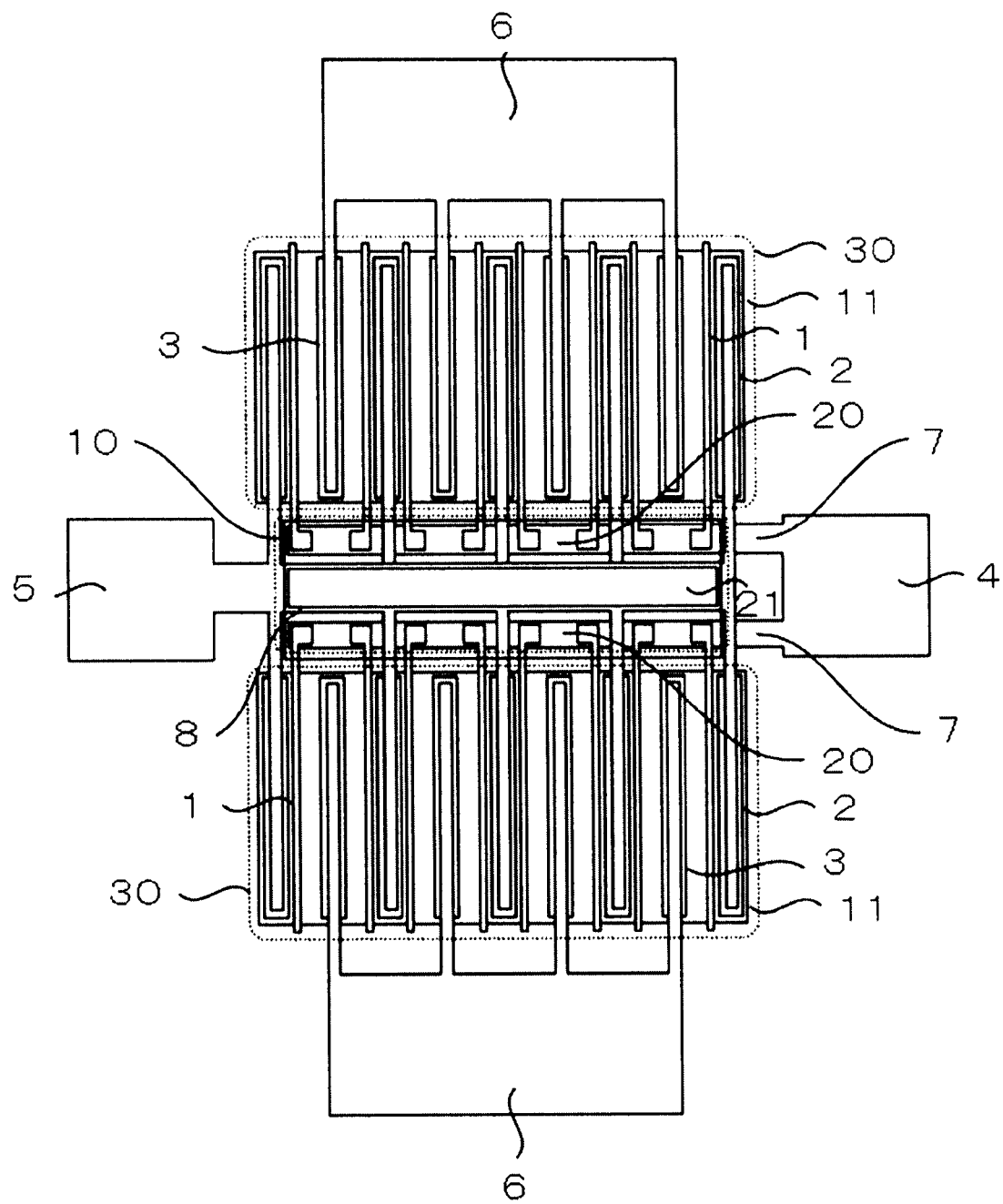
FIG. 11 is a top view of a semiconductor device according to a fourth embodiment.

FIG. 11 is a top view of a semiconductor device according to the fourth embodiment. The semiconductor device according to the fourth embodiment is the same as the first embodiment except that a source electrode bus interconnection 8 connected to the source electrode pad is used instead of the source electrode pad 5 according to the first embodiment, and the field-effect transistors 11 and protecting diode 10 are symmetrically arranged with respect to the source electrode bus interconnection 8. Although, with the semiconductor device in FIG. 11, the configuration of the field-effect transistor is doubled compared to the first embodiment, it is possible to form the diode 10 in a smaller space than in the first embodiment by sharing the source electrode pad 5. Further, the semiconductor device according to the fourth embodiment employs a configuration which is substantially doubled compared to the first embodiment, and can support a greater current. By enlarging the layout in the diagram of the semiconductor device described in the present embodiment or providing a plurality of layouts, it is possible to provide a greater current.

Although AlGaN/GaN-HEMT is used with the above present embodiment, the field-effect transistor is not limited to AlGaN/GaN-HEMT. Field-effect transistors of AlInGaN, InGaN and AlN which are nitride semiconductors and field-effect transistors of SiC, GaAs, InP, InGaAs and InGaP can also provide the same effect.

Although, with the semiconductor device according to the present embodiment, an anode electrode 20 and cathode electrode 21 in the bidirectional diode 12 are regularly (alternately) aligned, and alignment of the anode electrode and cathode electrode may be appropriately changed according to the purpose.

Although examples have been described above where, in the semiconductor device according to the present embodiment, the gate electrode bus interconnection 7 (as an anode electrode 20 of the diode 12) and the source electrode pad 5 or the source electrode bus interconnection 8 (as a cathode electrode 21 of the diode 12) are formed on semiconductor substrate 9, these are only examples. Consequently, as to a interconnection which connects the gate electrodes 1 and source electrodes 2 to the semiconductor substrate 9 in the diode forming area 10, the shape of the interconnection for the gate electrodes 1 and source electrodes 2 is not particularly limited as long as this shape allows formation of the diode 12 in an area adjacent to the field-effect transistor 11. Hence, with the present embodiment, interconnections for connecting the anode electrode 20 or cathode electrode 21 for forming the diode 12 of interest, with the electrode of the field-effect transistor 11 are collectively referred to as "bus interconnection" and "pad".

The drawings of semiconductor devices are all conceptual diagrams, and the number of the gate electrodes 1 in the drawings is described for ease of description of the configuration. By employing, for example, a configuration of folding and connecting a layout of a view of the semiconductor device described in the present embodiment or connecting a plurality of layouts, it is possible to make a chip larger and meet the demand for a greater current.

Although, with the present embodiment, the forming area 30 of the field-effect transistor is adjacent to an electrode side on which the gate electrode (bus interconnection or pad) and semiconductor substrate are connected, the source electrode side (bus interconnection or pad) may be adjacent to the forming area 30 of the field-effect transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a plurality of field-effect transistors which are arranged to be bent back symmetrically in multi-finger structures formed on the semiconductor substrate; and
a diode forming area which is adjacent to a forming area of the field-effect transistors,
wherein the diode forming area is insulated from the forming area of the transistors on the semiconductor substrate, and comprises a first diode electrode in which a gate electrode of one of the field-effect transistors is placed in contact with the semiconductor substrate by means of at least one of a Schottky barrier junction contact and an ohmic contact through at least one of a bus wiring and a pad, a second diode electrode in which a source electrode of said one of the field-effect transistors is placed in contact with the semiconductor substrate by means of at least one of an ohmic contact and a Schottky barrier junction contact through at least one of a bus wiring and a pad to form a diode between the gate electrode and the source electrode and the diode forming area is formed between the forming area of the field-effect transistors and a bus wiring or a pad of the source electrode,
in the first diode electrode, an electrode to be placed in Schottky barrier junction and an electrode to be placed in ohmic contact which are electrically insulated from each other on the semiconductor substrate are alternately arranged, in the second diode electrode, an electrode to be placed in ohmic contact and an electrode to be placed in Schottky barrier junction which are electrically insulated from each other on the semiconductor substrate are alternately arranged, the first diode electrode with Schottky barrier junction and the second diode electrode with ohmic contact form a first diode, the first diode electrode with ohmic contact and the second diode electrode with Schottky barrier junction form a second diode, an area of the first diode and an area of second diode are insulated on the semiconductor substrate, and a bidirectional diode is formed from the first diode and second diode whose diode-direction oppose to each other.

2. The semiconductor device according to claim 1, wherein the field-effect transistor is one of AlGaN/GaN, AlInGaN, InGaN, AlN, SiC, GaAs, InP, InGaAs and InGaP.

3. The semiconductor device according to claim 1, wherein the diode forming area and the forming area of the transistor are insulated by mesa-isolation.

4. The semiconductor device according to claim 1, wherein the diode forming area and the forming area of the transistor are insulated by ion implantation.

5. The semiconductor device according to claim 1, wherein the field-effect transistor is a normally on type.

6. The semiconductor device according to claim 1, wherein the field-effect transistor is a normally off type.

7. The semiconductor device according to claim 1, wherein the diode is provided per the gate electrode.

8. A semiconductor device comprising:
a semiconductor substrate;
a plurality of field-effect transistors which are arranged to be bent back symmetrically in multi-finger structures formed on the semiconductor substrate;
a diode forming area which is adjacent to a forming area of the transistors,
wherein the diode forming area is insulated from the forming area of the transistors on the semiconductor substrate, and comprises a first diode electrode in which a gate electrode of one of the field-effect transistor is placed in contact with the semiconductor substrate by means of at least one of a Schottky barrier junction contact and an ohmic contact through at least one of a bus wiring and a pad, a second diode electrode in which a source electrode of said one of the field-effect transistors is placed in contact with the semiconductor substrate by means of at least one of an ohmic contact and a Schottky barrier junction contact through at least one of a bus wiring and a pad to form a first diode between the gate electrode and the source electrode and the diode forming area is formed between the forming area of the field-effect transistors and a bus wiring or a pad of the source electrode,
the first diode is provided per the gate electrode, and
a second diode is provided in the diode forming area and has a third diode electrode and a fourth diode electrode oriented opposite to said first diode electrode and said second diode electrode of the first diode, the first diode being adjacent to the second diode.

9. The semiconductor device according to claim 8, wherein the field-effect transistor is one of AlGaN/GaN, AlInGaN, InGaN, AlN, SiC, GaAs, InP, InGaAs and InGaP.

10. The semiconductor device according to claim 8, wherein the diode forming area and the forming area of the transistor are insulated by mesa-isolation.

11. The semiconductor device according to claim 8, wherein the diode forming area and the forming area of the transistor are insulated by ion implantation.

12. The semiconductor device according to claim 8, wherein the field-effect transistor is a normally on type.

13. The semiconductor device according to claim 8, wherein the field-effect transistor is a normally off type.

* * * * *